United States Patent
Oikawa et al.

(10) Patent No.: US 6,758,684 B2
(45) Date of Patent: Jul. 6, 2004

(54) IC SOCKET

(75) Inventors: Takahiro Oikawa, Tokyo (JP); Masahiro Kawano, Tokyo (JP)

(73) Assignee: Yamaichi Electronics Co., Ltd., Tokyo (JP)

(*) Notice: Subject to any disclaimer, the term of this patent is extended or adjusted under 35 U.S.C. 154(b) by 0 days.

(21) Appl. No.: 10/161,641

(22) Filed: Jun. 5, 2002

(65) Prior Publication Data

US 2002/0187665 A1 Dec. 12, 2002

(30) Foreign Application Priority Data

Jun. 6, 2001 (JP) ......................................... 2001-171133

(51) Int. Cl.⁷ ............................................... H01R 12/00

(52) U.S. Cl. ........................... 439/73; 439/331; 439/525

(58) Field of Search .............................. 439/73, 70, 71, 439/61, 65, 55, 331, 330, 338, 341, 135, 142, 138, 136, 525, 526

(56) References Cited

U.S. PATENT DOCUMENTS

| | | | | |
|---|---|---|---|---|
| 4,887,969 A | * | 12/1989 | Abe | 439/73 |
| 5,573,427 A | * | 11/1996 | Sagano | 439/526 |
| 5,807,104 A | * | 9/1998 | Ikeya et al. | 439/73 |
| 6,106,319 A | * | 8/2000 | Fukunaga et al. | 439/342 |
| 6,439,897 B1 | * | 8/2002 | Ikeya | 439/73 |
| 6,443,741 B1 | * | 9/2002 | Watanabe | 439/71 |
| 6,517,370 B2 | * | 2/2003 | Fukunaga | 439/331 |

* cited by examiner

Primary Examiner—P. Austin Bradley
Assistant Examiner—Edwin A. Leon
(74) Attorney, Agent, or Firm—Finnegan, Henderson, Farabow, Garrett & Dunner, LLP

(57) ABSTRACT

In an IC socket of an open top type having a plurality of pin type contacts for electrical connection with an IC package inserted thereinto, the IC socket includes a socket body having a base plate, a vertically movable cover, a platform attached to the base plate and having an IC package mounting portion, and edge moving mechanisms each having a latch lever for holding the IC package placed on the platform and adapted to move the IC package from one side to the opposite side for adjusting and correcting the position of the IC package.

12 Claims, 4 Drawing Sheets

IC SOCKET

This application is based on Patent Application No. 2001-171133 filed Jun. 6, 2001 in Japan, the content of which is incorporated herein by reference.

BACKGROUND OF THE INVENTION

1. Field of the Invention

The present invention relates to an IC socket for connecting contacts of a socket body to external terminals of an IC package, an electronic part, and more particularly to an IC socket which has edge moving mechanisms for positioning an IC package placed on a platform.

2. Description of the Related Art

Among conventional IC sockets that receive a package for electronic parts as an electrical components, particularly an IC package, there is known an IC socket which makes an electric connection with solder balls that constitute external terminals of the IC package to be mounted on a base plate of the socket body.

In such a conventional IC socket, a center of the IC socket is positioned in such a manner to be aligned with a center of the IC package by adjusting positions of IC package positioning portions at four sides of the IC socket. Hence, the center positions of the positioning portions of the IC socket may deviate horizontally or vertically, making it difficult to make contacts at the same positions at all times. There may arise a positioning where the contacts of the socket body fail to contact with the solder balls of the IC package.

To solve these problems experienced with the conventional IC sockets, it is therefore an object of the present invention to provide an IC socket in which a plate spring is provided with a latch lever which has an edge moving mechanism. Immediately before the latch lever is fully closed, the plate spring operates to move the IC package from one side to the other in order to position the IC package.

SUMMARY OF THE INVENTION

In order to achieve the above object, the IC socket of the present invention comprises, in an open top type of the IC socket having a plurality of pin type contacts for electrical connection with an IC package inserted into the IC socket, a socket body having a base plate, a vertically movable cover, a platform attached to the base plate and having an IC package mounting portion, and edge moving mechanisms each having a latch lever for holding the IC package placed on the platform and adapted to move the IC package from one side to an opposite side for a positioning of the IC package. With this construction, the IC package can be moved from one side to the other by the plate spring for a positioning before the latch lever is fully closed.

Further, in the IC socket of the present invention, since the edge moving mechanisms are located at almost the centers of the two adjoining sides of the IC socket respectively, the numbers of dimensional controlling portions for the positioning portions between the contacts and the IC package reduces from four to two and time taken for adjusting check the positioning portion is shortened to improve the efficiency of task.

Furthermore, in the IC socket of the present invention, the edge moving mechanisms each has a plate spring provided on the underside of the latch lever, has an outer end of the latch lever pivotally supported on the IC socket and holds the IC package between an inner end of the latch lever and the platform, and therefore the edge moving mechanisms can be formed in a simple construction comprising the latch lever and the plate spring.

Further, in the IC socket of the present invention, the plate spring engages the molded portion of the IC package and moves it from one side to the other before the latch lever is fully closed, and therefore the IC package can be correctly positioned and held by the latch lever.

Because the edge moving mechanisms of the IC socket of the present invention are arranged by selecting one of corner portions of the IC package mounting portion as a reference fixed positioning portion, the number of dimensional controlling portions required for establishing a positional alignment between the contacts and the IC package decreases from four portions to two, which make it possible to shorten the time it takes to adjust the positioning portions and improves the positioning operation efficiency.

Furthermore, since the IC package of the present invention is of a ball grid array type(BGA) or a land grid array type(LGA), the IC socket can accept the IC package properly and be formed in a simple construction.

Other objects, features and advantages of the present invention will become more apparent from the following detailed description on the IC socket of one embodiment thereof taken in conjunction with the attached drawings.

DETAILED DESCRIPTION OF PREFERRED EMBODIMENTS

Figure 1:
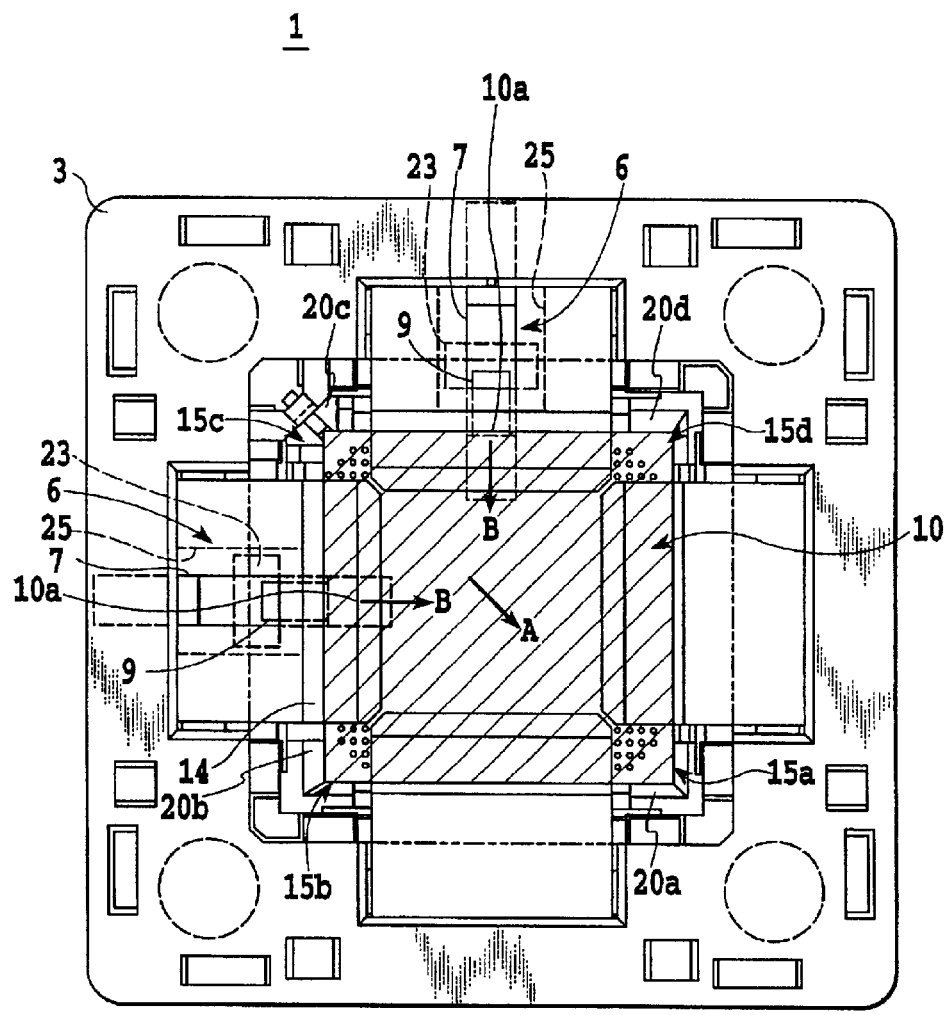
FIG. 1 is a plan view showing one embodiment of the IC socket according to the present invention.
Figure 2:
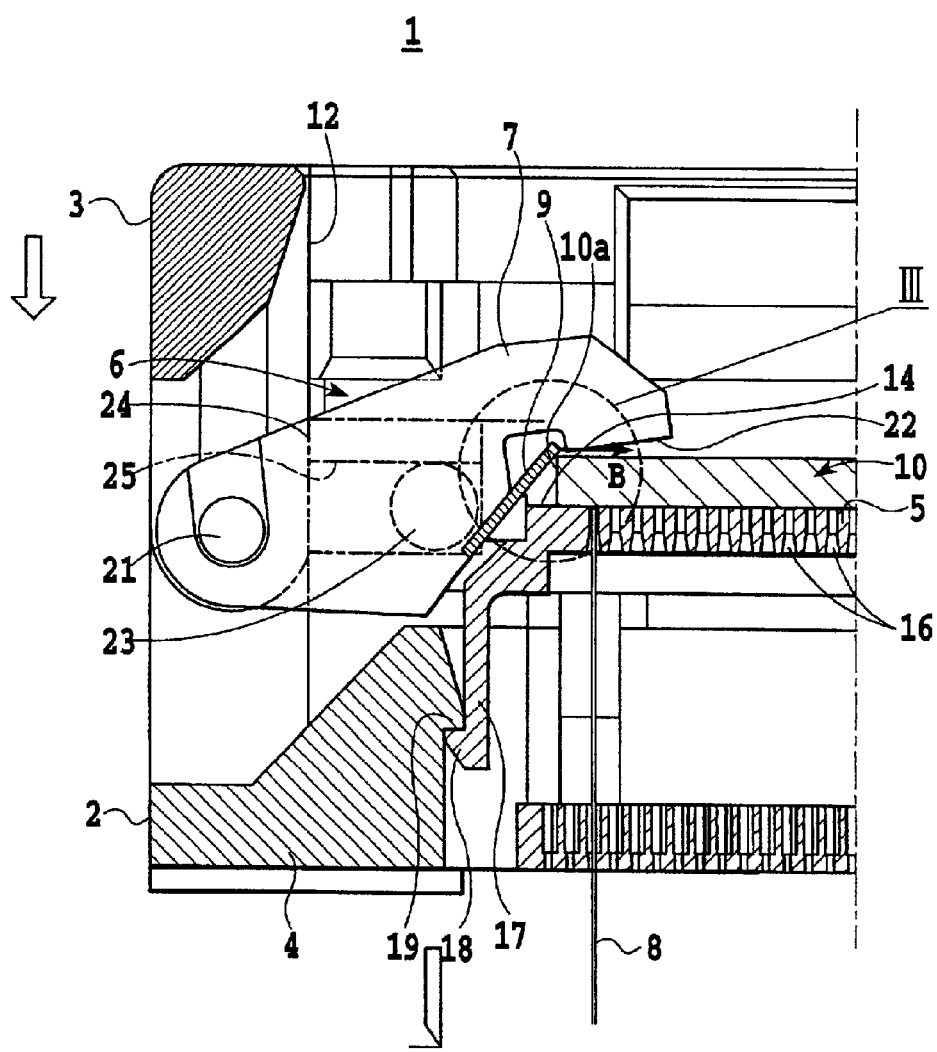
FIG. 2 is a central cross section of the IC socket of FIG. 1, showing a state immediately before the IC package is brought into contact with the IC socket by a latch lever and a plate spring.
Figure 3:
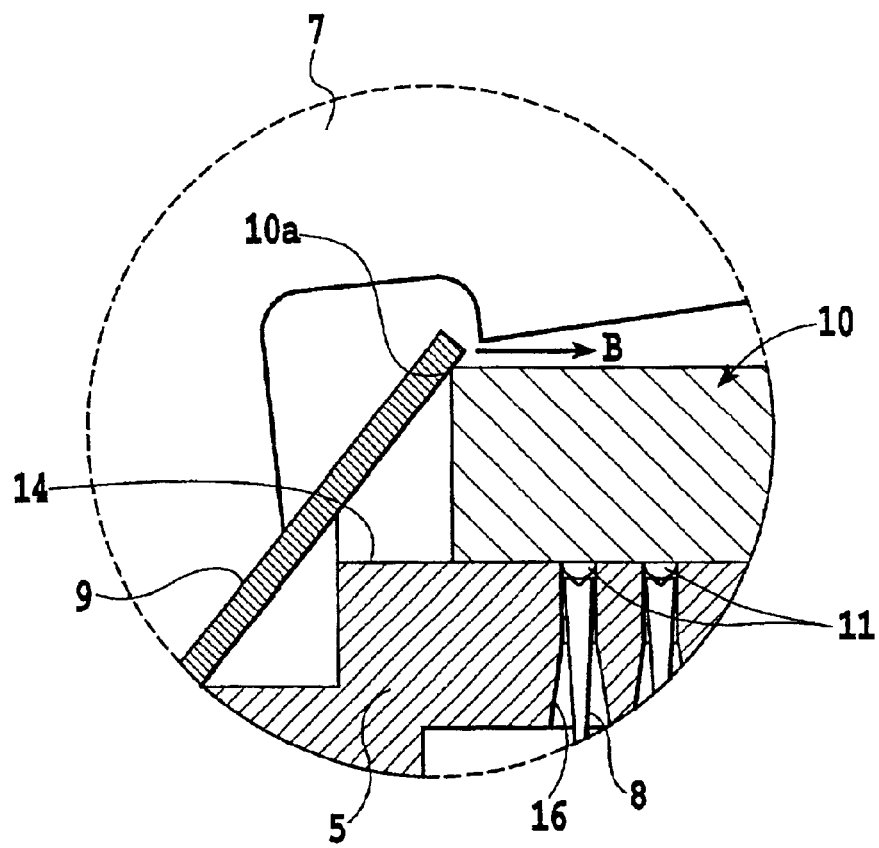
FIG. 3 is an enlarged view of a portion enclosed by a circle III in FIG. 2.
Figure 4:
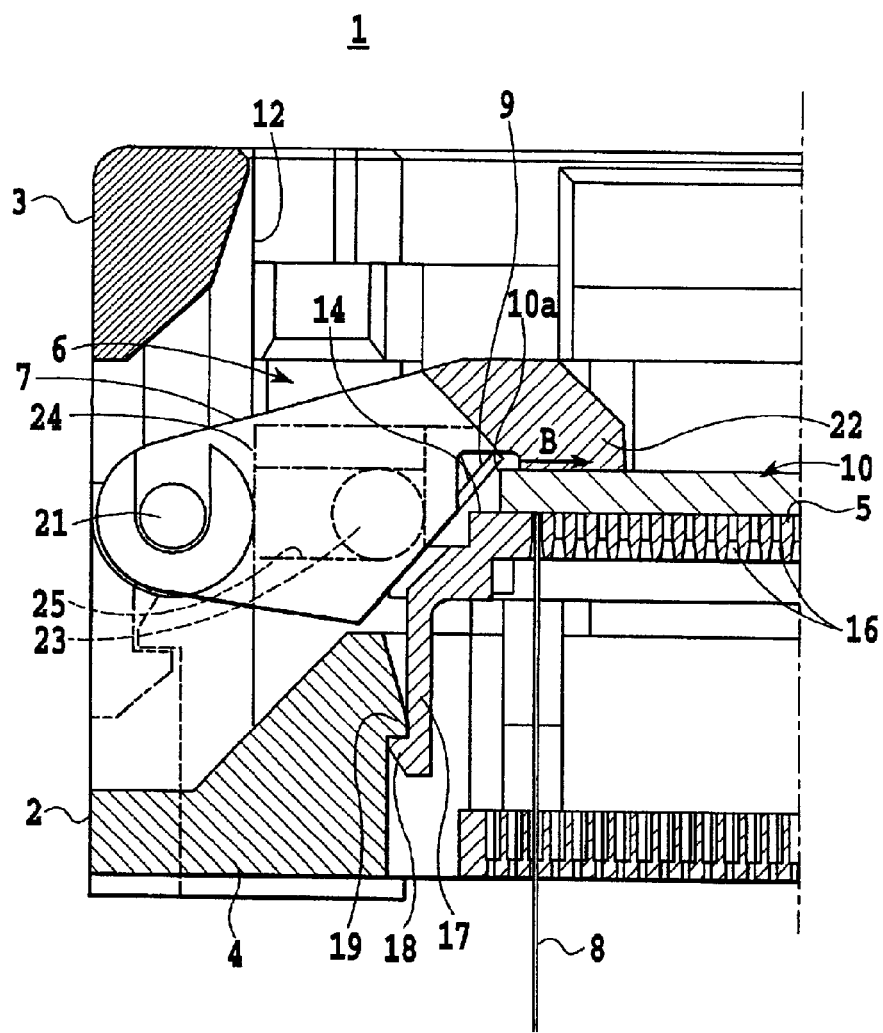
FIG. 4 is a central cross section of the IC socket of the invention, showing a state in which the IC package is mounted on and brought into contact with the IC socket according to the present invention.

FIG. 1 to FIG. 4 illustrate one embodiment of the IC socket of the present invention. FIG. 1 is a plan view of one embodiment of the IC socket, FIG. 2 is a cross sectional view showing a latch lever of edge moving mechanisms of the present invention, FIG. 3 is an enlarged view of a plate spring of the latch lever shown in FIG. 2 enclosed by a circle III, and FIG. 4 is a cross sectional view showing an IC package brought into contact with the IC socket by the latch lever of the edge moving mechanisms of the present invention.

As shown in these figures, the IC socket 1 of the present invention is an open-top type IC socket having a plurality of pin type contacts 8 that make electrical connections with an IC package 10. The IC socket 1 comprises a socket body 2 with a base plate 4 at a peripheral portion, a vertically movable cover 3, a platform 5 attached to the base plate 4 and having an IC package mounting portion 14 on which the IC package 10 is mounted, edge moving mechanisms 6 each having a latch lever 7 for holding the IC package 10 placed on the platform 5 and designed to move the IC package 10 from one side to the opposite side to position the IC package 10 in its place on the platform 5, and a plurality of pin type contacts 8 for making electrical connections with solder balls 11 of the IC package 10.

In this embodiment, the IC package 10 used is of a ball grid array type which has protruding semispherical solder balls 11 as external terminals. The IC package 10 as employed in the present invention is not limited to the ball grid array type, but other types, for example a land grid array type of IC package may also be employed.

In the IC socket 1 of the present invention, the socket body 2 has a fixed base plate 4 at its periphery and a plurality of pin type contacts 8 arranged in lattice or matrix in the central portion, with the contacts 8 extending upwardly through the base plate 4. Each of these contacts 8 has a plurality of projecting ears at the upper end thereof, between which almost semispherical or spherical protruding solder balls 11 such as external terminals are received and clamped under pressure to make good electrical connections. The shape of the upper ends of the contacts 8 is not limited to the shape where the plurality of ears projecting but, as a matter of fact, may be formed in any other desired shape as long as the upper ends of contacts 8 can receive and make good electrical contact with the solder balls 11 of the IC package 10.

Further, in the IC socket 1 of the present invention, the vertically movable cover 3 is provided in the form of an open top type frame and arranged above a peripheral portion of the base plate 4. The cover 3 is provided with openings 12 for installing the IC package 10 in the inner side thereof, which simultaneously from an inserting portion for the IC package 10 onto the IC package mounting portion 14 on platform. Further, L-shaped positioning portions 15a, 15b, 15c, 15d are provided for positioning four corners of the IC package 10 in such a manner corresponding to the IC package mounting portion 14 of the platform 5.

These positioning portions 15a, 15b, 15c, 15d are formed from L-shaped positioning members 20a, 20b, 20c, 20d, each having a shape like a corner member, respectively. One of the positioning portions 15a, 15b, 15c, 15d, in this embodiment the lower right positioning portion 15a in FIG. 1, is selected as a reference fixed positioning portion. As will be hereinafter described, there are arranged two edge moving mechanisms at two side portions adjacent positioning portion 15c (upper left positioning portion of FIG. 1) toward the right and left directions, respectively, the positioning portion 15c lies in the diagonal direction from the reference positioning portion 15a. It is more preferable for the positioning portion 15a to be arranged in an adjustable manner by a screw or the like which allows the positioning member 20c to move for positioning.

The platform 5 is formed with a plurality of holes 16 arranged in lattice or matrix. The holes 16 are tapered to downwardly expand so that the upper end of each contact 8 can easily be inserted upward into the corresponding hole from below. Further, the platform 5 has locking claws 18 formed at free ends of downwardly extending arm members 17 which allows the platform 5 to be removably mounted onto the base plate 4 of the socket body 2. Locking claws 18 are capable of locking to or being unlocked from claw receiving portions 19 of the base plate 4 of the socket body 2. Thus, the locking claws 18 of the arm members 17 and the claw receiving portions 19 of the base plate 4 of the socket body 2 combine to form a latch mechanism that can be engaged and disengaged.

The two edge moving mechanisms 6 provided at the two adjoining sides of the socket body 2 are designed to move the IC package 10 horizontally to adjust its position. Each of the edge moving mechanisms 6 has a rotatable latch lever 7 to hold the IC package 10 placed on the IC package mounting portion 14 of the platform 5. The latch lever 7 is pivotally supported at its outer end by a pin 21 on the socket body 2 and, at its inner end, has a press portion 22 for pushing the IC package 10 against the platform 5 to hold it firmly. The latch lever 7 has a slide pin 23 protruding from its side at almost the center which is loosely fitted in a horizontal slot 25 in a vertically movable drive member 24. An up and down movement of the drive member 24 causes the latch lever 7 to pivot about the pin 21 to press the IC package 10 by the press portion 22 from above onto the platform 5 to allow the IC package to be held therebetween or to be released from the holding condition.

Further, on the underside of the latch lever 7 is provided with a plate spring 9 of the edge moving mechanisms 6 which has one part thereof, such as a lower end, secured to the latch lever 7 by welding or screw. In the process of pivoting the latch lever 7 to hold the IC package 10, immediately before the latch lever 7 is fully closed, the plate spring 9 comes into contact with a molded portion 10a of the edge of the IC package 10 placed on the platform 5 and pushes it inwardly in the direction of an arrow B in FIG. 2 and FIG. 3 (in a direction almost perpendicular to the edge of the IC package 10) to press the IC package 10 against the positioning portion which performs adjustment of the dimension on the opposite side, and thus achieving the positioning of the IC package correctly. This positioning operation is also performed on the other edge moving mechanism 6 in the similar manner so that a position adjusting force produced by the combined edge moving operations acts on the IC package 10 in a diagonal direction as shown by an arrow A of FIG. 1, thereby accomplishing the desired purpose of edge moving to achieve a correct positioning.

In the two edge moving mechanisms 6 of the IC socket 1 according to the present invention, the latch lever 7 is closed in a condition that the plate spring 9 pushes the IC package 10 inwardly against the associated positioning portion bringing the solder balls 11 as external terminals of the IC package 10 into electrical connection with the contacts 8. Hence, the IC package 10 is always placed at the same position, making it possible to take measurements of IC packages at the same position at all times. This ensures stable measurements. Further, since the IC package 10 is pressed against the positioning portion at one side by edge moving, the positional alignment between the contacts 8 and the IC package 10 can be established by only two dimensional controlling portions, down from four dimensional controlling portions required in the conventional IC socket, and thus shortening the time for adjusting the positioning portions and improving the positioning operation efficiency.

Further, the IC socket of the present invention with the construction described above allows an IC package 10 to be inserted properly into the IC socket manually or automatically using automated machines, such as robots. The edge moving mechanisms 6 of the present invention ensure a correct positioning of the IC package and improve the process of mounting the IC package onto the IC socket and also its efficiency.

The present invention has been described in detail with respect to the preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An IC socket of an open top type having a plurality of pin type contacts for electrical connection with an IC package inserted into the IC socket comprising:
    a socket body having a base plate;
    a movable cover;
    a platform attached to the base plate and having an IC package mounting portion and positioning portions; and
    edge moving mechanisms configured to exert downward force on an IC package sufficient to hold the IC package in place on the platform and configured to exert lateral force on an IC package and to thereby adjust the IC package in a horizontal direction bringing the IC package in contact with the positioning portions;
    wherein the edge moving mechanisms each have a latch lever, having an outer end pivotally supported on the IC socket and an inner end, and said edge moving mechanisms each further having a plate spring provided on an underside of the latch lever, said edge moving mechanisms collectively holding the IC package between the inner end of the latch lever and the platform; and
    wherein, before the latch lever is fully closed, the plate spring engages a molded portion of the IC package, exerting a force sufficient to adjust the IC package in the horizontal direction.

2. An IC socket as claimed in claim 1, wherein the edge moving mechanisms are arranged by selecting a corner portion of the IC package mounting portion as a reference positioning portion.

3. An IC socket as claimed in claim 1, wherein the IC package is of a ball grid array type.

4. An IC socket as claimed in claim 1, wherein the edge moving mechanisms exert the lateral force adjusting the position of the IC package in the horizontal direction to bring the IC package into contact with positioning portions before the edge moving mechanisms exert the downward force sufficient to hold the IC package in place on the platform.

5. An IC socket of an open top type having a plurality of pin type contacts for electrical connection with an IC package inserted into the IC socket comprising:
    a socket body having a base plate;
    a vertically movable cover;
    a platform attached to the base plate and having an IC package mounting portion and positioning portions; and
    edge moving mechanisms, said edge moving mechanisms comprising:
        a latch lever configured to engage a top portion of an IC socket and exert a downward force when said edge moving mechanism is pivoted downward in the vertical direction; and
        a plate spring positioned on the underside of the latch lever to engage an edge portion of an IC socket and to exert a horizontal force when said edge moving mechanism is pivoted downward in the vertical direction;
    wherein, before the latch lever is fully closed, the plate spring engages a molded portion of the IC package, exerting a force sufficient to adjust the IC package in the horizontal direction.

6. An IC socket as claimed in claim 5, wherein said latch lever is pivotally supported at its outer end by a pin on the socket body and has a press portion on its inner end and a slide pin protruding from its side loosely fitted in a horizontal slot in a vertically movable drive member.

7. An IC socket as claimed in claim 5, wherein said plate spring is configured to engage an edge portion of an IC socket and exert a horizontal force before said latch lever exerts a downward force on said top portion of an IC package when the edge moving mechanism is pivoted downward in the vertical direction.

8. An IC socket as claimed in claim 5, wherein the edge moving mechanisms are arranged by selecting a corner portion of the IC package mounting portion as a reference positioning portion.

9. An IC socket of an open top type having a plurality of pin type contacts for electrical connection with an IC package inserted into the IC socket comprising:
    a socket body having a base plate;
    a movable cover;
    a platform attached to the base plate and having an IC package mounting portion and positioning portions; and
    edge moving mechanisms configured to exert downward force on an IC package sufficient to hold the IC package in place on the platform and configured to exert lateral force on an IC package and to thereby adjust the IC package in a horizontal direction bringing the IC package in contact with the positioning portions, and further configured to exert the combined edge moving forces on the IC package in a diagonal direction, the mechanisms being provided at virtually centers of the two adjoining sides of the IC socket, respectively;
    wherein the edge moving mechanisms each have a latch lever, having an outer end pivotally supported on the IC socket and an inner end, and said edge moving mechanisms each further having a plate spring provided on an underside of the latch lever, said edge moving mechanisms collectively holding the IC package between the inner end of the latch lever and the platform; and
    wherein, before the latch lever is fully closed, the plate spring engages a molded portion of the IC package, exerting a force sufficient to adjust the IC package in the horizontal direction.

10. An IC socket as claimed in claim 9, wherein the edge moving mechanisms are arranged by selecting a corner portion of the IC package mounting portion as a reference positioning portion.

11. An IC socket as claimed in claim 9, wherein the IC package is of a ball array type.

12. An IC socket as claimed in claim 9, wherein the edge moving mechanisms exert the lateral force adjusting the position of the IC package in the horizontal direction to bring the IC package into contact with positioning portions before the edge moving mechanisms exert the downward force sufficient to hold the IC package in place on the platform.

* * * * *